US011959851B2

(12) United States Patent
Okabe et al.

(10) Patent No.: US 11,959,851 B2
(45) Date of Patent: Apr. 16, 2024

(54) PIPELINE THICKNESS MEASUREMENT SENSOR DEVICE

(71) Applicant: Yokogawa Electric Corporation, Tokyo (JP)

(72) Inventors: Nobuo Okabe, Tokyo (JP); Satoshi Yoshitake, Tokyo (JP); Kazuma Takenaka, Tokyo (JP); Yoshiaki Tanaka, Tokyo (JP); Shumpei Ito, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 204 days.

(21) Appl. No.: 17/427,673

(22) PCT Filed: Dec. 27, 2019

(86) PCT No.: PCT/JP2019/051633
§ 371 (c)(1),
(2) Date: Aug. 2, 2021

(87) PCT Pub. No.: WO2020/194975
PCT Pub. Date: Oct. 1, 2020

(65) Prior Publication Data
US 2022/0146406 A1 May 12, 2022

(30) Foreign Application Priority Data
Mar. 28, 2019 (JP) .................................. 2019-065081

(51) Int. Cl.
*G01N 17/04* (2006.01)
*G01B 7/06* (2006.01)
*G01B 17/02* (2006.01)

(52) U.S. Cl.
CPC ............... *G01N 17/04* (2013.01); *G01B 7/10* (2013.01); *G01B 17/02* (2013.01)

(58) Field of Classification Search
CPC .......... G01B 17/02; G01B 21/08; G01B 7/06; G01B 7/10; G01N 17/04; G01R 33/0005; G01R 33/0082; G01R 33/0094
See application file for complete search history.

(56) References Cited

U.S. PATENT DOCUMENTS

2008/0163700 A1* 7/2008 Huang ................. G01B 17/025
73/861.25
2015/0330946 A1 11/2015 Davis
(Continued)

FOREIGN PATENT DOCUMENTS

| CN | 108088900 A | 5/2018 |
| CN | 108226227 A | 6/2018 |

(Continued)

OTHER PUBLICATIONS

Office Action issued for counterpart Japanese Application No. 2019-065081, issued by the Japanese Patent Office dated Mar. 23, 2021 (drafted on Mar. 11, 2021).
(Continued)

*Primary Examiner* — Jay Patidar

(57) ABSTRACT

An absolute thickness distribution cannot be accurately calculated with a conventional technique. A sensor device is provided that includes a plurality of magnetic sensors arranged to face an outer circumference surface of a pipeline and ultrasonic sensors arranged to face the outer circumference surface and measure a thickness of the pipeline in a measurement region in which the plurality of magnetic sensors measure a magnetic field, the ultrasonic sensors being less than the plurality of magnetic sensors.

17 Claims, 9 Drawing Sheets

(56) References Cited

U.S. PATENT DOCUMENTS

| | | | |
|---|---|---|---|
| 2018/0259486 A1 | | 9/2018 | Babcock, IV |
| 2019/0145934 A1* | | 5/2019 | Feng .................. G01N 27/9046 |
| | | | 324/222 |
| 2019/0271663 A1 | | 9/2019 | Ishikawa |

FOREIGN PATENT DOCUMENTS

| | | | | |
|---|---|---|---|---|
| CN | 108226277 A | * | 6/2018 | ............. G01N 27/83 |
| CN | 109521083 A | | 3/2019 | |
| EP | 3236252 A1 | | 10/2017 | |
| JP | 2017003574 A | | 1/2017 | |
| JP | 2018119993 A | | 8/2018 | |
| JP | 6447641 B2 | | 1/2019 | |
| WO | 2009156862 A2 | | 12/2009 | |
| WO | 2013044350 A1 | | 4/2013 | |

OTHER PUBLICATIONS

International Search Report and (ISA/237) Written Opinion of the International Search Authority for International Patent Application No. PCT/JP2019/051633, mailed by the European Patent Office dated Apr. 17, 2020.

* cited by examiner

PIPELINE THICKNESS MEASUREMENT SENSOR DEVICE

CROSS-REFERENCE TO RELATED APPLICATIONS

This application is a National Stage Entry of International Application No. PCT/JP2019/051633, filed on Dec. 27, 2019, which claims priority to Japanese Patent Application No. 2019-065081, filed on Mar. 28, 2019, the contents of each of which are hereby incorporated by reference in their entirety.

1. TECHNICAL FIELD

The present invention relates to a sensor device and a pipeline monitoring system.

RELATED ART

Conventionally, a method has been proposed (see, for example, Japanese Patent No. 6447641) for calculating a thinning distribution of a pipeline by measuring a distribution of the intensity of a magnetic field leaked from a corrosion region of the pipeline with a plurality of magnetic sensors disposed on the outer circumference of the pipeline.

SUMMARY

However, an absolute thickness distribution cannot be accurately calculated with the conventional technique.

To solve the above-described problem, a first aspect of the present invention provides a sensor device. The sensor device may include a plurality of magnetic sensors arranged to face an outer circumference surface of a pipeline. The sensor device may include ultrasonic sensors arranged to face the outer circumference surface and measure a thickness of the pipeline in a measurement region in which the plurality of magnetic sensors measure a magnetic field, the ultrasonic sensors being less than the plurality of magnetic sensors.

A second aspect of the present invention provides a pipeline monitoring system. The pipeline monitoring system may include a plurality of sensor devices including the sensor device according to the first aspect. The pipeline monitoring system may include a calculation device that calculates based on a measurement result from each of the sensor devices, a thickness distribution of the pipeline in a mounted region of the sensor devices.

The summary clause does not necessarily describe all necessary features of the embodiments of the present invention. The present invention may also be a sub-combination of the features described above.

DESCRIPTION OF EXEMPLARY EMBODIMENTS

The present invention will now be described through some embodiments, which are not intended to limit the invention as set forth in the appended claims. Not all of the combinations of features described in such embodiments are essential for the means for solving the problems achieved by the invention.

Figure 1:
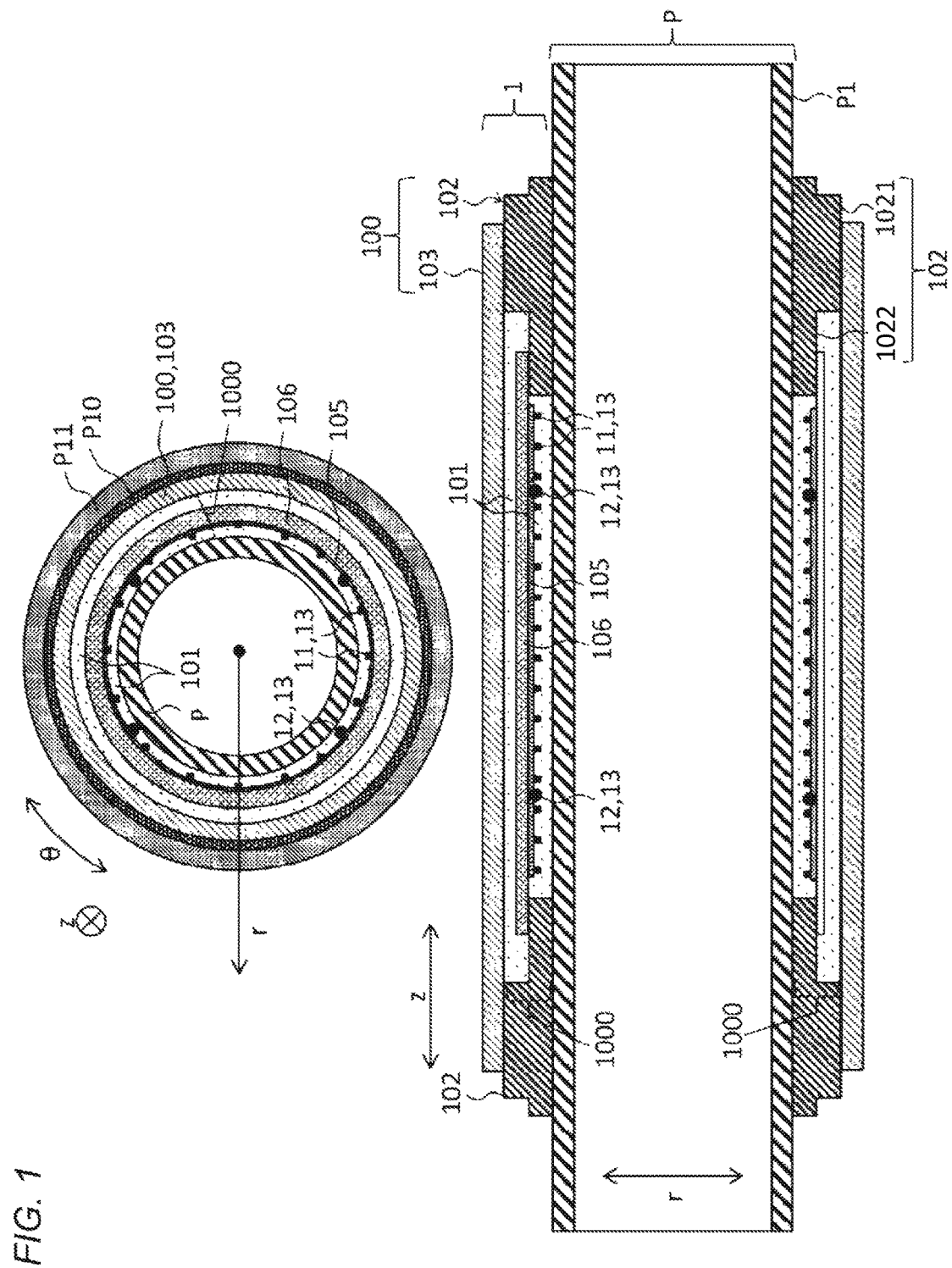
FIG. 1 shows a pipeline P and a sensor device 1 according to an embodiment.

[1. Pipeline and sensor device] FIG. 1 shows a pipeline P and a sensor device 1 according to the present embodiment. Note that upper and lower parts of the figure respectively show cross sections orthogonal to and parallel with a longitudinal direction (also referred to as an axial direction).

[2. Pipeline P] The pipeline P is a pipeline for conveying fluid. For example, the pipeline P may transport fossil fuels, and transports a natural resource such as petroleum and natural gas for example in the present embodiment.

The pipeline P may be disposed in a plant or disposed on the seabed, and may be provided in deep water not deeper than 3000 meters, for example. For example, the pipeline P is laid on the seabed by the J-lay method, but may also be laid by the reel method or the S-lay method. The pipeline P may be deflected when being laid or after being laid by receiving external force due to landslide and water flow.

The pipeline P may be made of a magnetic material such as carbon steel. For example, the pipeline P may have a pipe diameter (outer diameter) of 323.8 mm. For example, the pipeline P may have a thickness of 21.44 mm. For example, the pipeline P may be formed by welding and connecting pipes that are each 15 to 20 m long, to have a length of about 10 to 100 km.

A corrosion resistance layer P10 and a thermal insulation layer P11 may be provided on the outer side of an outer circumference surface P1 of the pipeline P. For example, the corrosion resistance layer P10 may have a three layer structure including a thermally welded epoxy resin layer, a copolymer adhesive layer, and a polypropylene layer. For example, the thermal insulation layer P11 may foam made of polypropylene resin or the like. Note that even if the corrosion resistance layer P10 and the thermal insulation layer P11 are provided, corrosion (full corrosion or partial corrosion) may occur on the pipeline P. In the lower part of the figure, the corrosion resistance layer P10 and the thermal insulation layer P11 are omitted.

[3. Sensor device 1] Sensor devices 1 are disposed on the outer side of the pipeline P, and measure data about the thickness of the pipeline P. If the corrosion resistance layer P10 and the thermal insulation layer P11 are provided on the outer circumference surface P1 of the pipeline P, the sensor devices 1 may be disposed on the inner side of these layers. The sensor devices 1 may be dispersed along a longitudinal direction z of the pipeline P, and may be arranged at a 1-km interval, for example. The sensor devices 1 each include a plurality of magnetic sensors 11, ultrasonic sensors 12 that are less than the magnetic sensors 11, and one or a plurality of temperature sensors 13, a substrate 105, and a sensor housing 106 that are contained in a case portion 100. The substrate 105 and the sensor housing 106 may not be provided to the sensor device 1.

[3-1. Case portion 100] The case portion 100 forms an internal space 1000, holding liquid 101, around a part of the outer circumference of the pipeline P in the longitudinal direction z. The magnetic sensors 11 and the ultrasonic sensors 12 are each disposed in the liquid 101. The case portion 100 may include two end portion members 102 and a case portion main body 103 that define the internal space 1000 together with the outer circumference surface P1 of the pipeline P.

[3-1-1. Liquid 101] The liquid 101 is insulative and is insulation oil, for example. The liquid 101 may insulate an internal circuit of the sensor device 1 from peripheral conductors while protecting the internal circuit from corrosion. In the present embodiment, for example, the liquid 101 may transmit ultrasonic waves used for measurement by the ultrasonic sensors 12, and may protect the internal circuit of the sensor device 1 from an impact on the pipeline P. For example, the liquid 101 may be electrical insulation oil defined in JIS C 2320.

[3-1-2. End portion member 102] The two end portion members 102 are disposed on both sides of the internal space 1000 in the longitudinal direction z. The end portion members 102 may be formed annularly and coaxially with the pipeline P, and may each be in contact with the outer circumference surface P1 over the entire circumference of the pipeline P. The end portion members 102 may each include an annular first supporting surface 1021 and a second supporting surface 1022 on the outer circumference side.

The first supporting surface 1021 may be provided on an end side of the sensor device 1 in the longitudinal direction z. The second supporting surface 1022 may be provided more on the center side of the sensor device 1 than the first supporting surface 1021 in the longitudinal direction z, and may be closer to the outer circumference surface P1 than the first supporting surface 1021. In other words, the second supporting surface 1022 may be at a lower level than the first supporting surface 1021, from the outer circumference surface P1 of the pipeline P.

The end portion members 102 described above may be made of the same material as the pipeline P. The end portion members 102 may each be formed by fitting and welding two annular plates with different diameters.

[3-1-3. Case portion main body 103] The case portion main body 103 extends between the two end portion members 102 in the longitudinal direction z and is in contact with outer circumference surfaces of the end portion members 102 over the entire circumference of the pipeline P. For example, in the present embodiment, the case portion main body 103 is in contact with the first supporting surfaces 1021 of each of the end portion members 102 and is supported by the first supporting surfaces 1021. The case portion main body 103 may be formed in a tube coaxial with the pipeline P. The case portion main body 103 may be made of the same material as the pipeline P. The case portion main body 103 may have an outer diameter of 420 mm, for example, and a thickness of 10 mm to 50 mm, for example. The case portion main body may have a length in the longitudinal direction z of 1000 mm, for example.

[3-2. Magnetic sensor 11] The magnetic sensors 11 are each disposed to face the outer circumference surface P1 of the pipeline P. The magnetic sensors 11 measure the intensity of a magnetic field leaking from the pipeline P toward the outer circumference side. For example, in the present embodiment, the magnetic sensors 11 may be disposed in the liquid 101, and the liquid 101 may be interposed between each of the magnetic sensors 11 and the outer circumference surface P1 of the pipeline P. The magnetic sensors 11 may each measure the magnetic field on the outer circumference side of the pipeline P facing the magnetic sensors 11 with the liquid 101 interposed therebetween. The magnetic sensors 11 may each measure the magnetic field intensity (also referred to as magnetic flux density) in three-dimensional directions (in the present embodiment, the longitudinal direction z, a circumference direction θ, and a radial direction r of the pipeline P, for example).

The measurement region in which the plurality of magnetic sensors 11 measure the magnetic field may seamlessly continue along the circumference direction θ and the longitudinal direction z of the pipeline P. For example, in the present embodiment, the measurement region may extend over 500 mm in the longitudinal direction z, and may extend in the circumference direction θ over the entire circumference of the pipeline P. The number of the magnetic sensors 11 provided to the sensor device 1 may be about 600 to 1200. The magnetic sensors 11 may each be disposed on the substrate 105.

[3-3. Ultrasonic sensor 12] The ultrasonic sensors 12 face the outer circumference surface P1, and measure the thickness of the pipeline P in the measurement region in which the plurality of magnetic sensors 11 measure the magnetic field. For example, in the present embodiment, the ultrasonic sensors 12 may be disposed in the liquid 101, and the liquid 101 is interposed between each of the ultrasonic sensors 12 and the outer circumference surface P1 of the pipeline P. The ultrasonic sensors 12 may each measure the thickness of the pipeline P facing the ultrasonic sensors 12 with the liquid 101 interposed therebetween.

The number of the ultrasonic sensors 12 may be smaller than the number of the magnetic sensors 11. For example, the number of the ultrasonic sensors 12 may be less than one tenth of the number of the magnetic sensors 11, or may be less than one one-hundredth of the number of the magnetic sensors 11. For example, in the present embodiment, the sensor device 1 may be provided with eight ultrasonic sensors 12. The ultrasonic sensors 12 may each be disposed on the substrate 105.

Power consumption for the measurement performed by the ultrasonic sensors 12 may be larger than power consumption for the measurement performed by the magnetic sensors 11. The measurement interval of the ultrasonic sensors 12 may be longer than the measurement interval of the magnetic sensors 11. For example, the measurement interval of the magnetic sensors 11 may be once a day, whereas the measurement interval of the ultrasonic sensors 12 may be once a week. The magnetic sensors 11 in one of the sensor devices 1 may perform the measurement at the same timing or at timings different from each other. Similarly, the ultrasonic sensors 12 in one of the sensor devices 1 may perform the measurement at the same timing or at timings different from each other.

[3-4. Temperature sensor 13] The temperature sensors 13 each measure temperature in a measurement environment of the sensor device 1. For example, in the present embodiment, the number of the temperature sensors 13 provided to the sensor device 1 is the same as the total number of the magnetic sensor 11 and the ultrasonic sensor 12. The temperature sensors 13 are disposed in the vicinity of the respective magnetic sensors 11 and the respective ultrasonic sensors 12 and measure the temperature of the respective magnetic sensors 11 or the respective ultrasonic sensors 12. The liquid 101 may be interposed between each of the temperature sensors 13 and the outer circumference surface P1 of the pipeline P. In the figure, the temperature sensors 13 are shown to be integrated with the respective magnetic sensors 11 and the respective ultrasonic sensors 12. Alternatively, the temperature sensor 13 and the magnetic sensor 11 may be separately provided, and the temperature sensor 13 and the ultrasonic sensor 12 may be separately provided. The number of the temperature sensors 13 may not be the same as the total number of the ultrasonic sensors 12 and the magnetic sensors 11, and may be one, for example. The temperature sensors 13 may not be provided to the sensor device 1.

[3-5. Substrate 105] The substrate 105 supports each of the magnetic sensors 11, the ultrasonic sensors 12, and the temperature sensors 13, and is provided to face the outer circumference surface P1 of the pipeline P. For example, the substrate 105 may be a flexible substrate such as a printed circuit board, and may have one surface provided with the magnetic sensors 11, the ultrasonic sensors 12, and the temperature sensors 13. The substrate 105 may be deflected to be formed in a tube coaxial with the pipeline P, with the magnetic sensors 11, the ultrasonic sensors 12, and the temperature sensors 13 provided on the inner side. The distance between the substrate 105 and the outer circumference surface of the pipeline P (that is, the thickness of a layer of the liquid 101 more on the inner side than the substrate 105) may be 10 mm. Thus, a uniform distance of 10 mm is provided between the outer circumference surface P1 of the pipeline P and each of the magnetic sensors 11, the ultrasonic sensors 12, and the temperature sensors 13.

The substrate 105 may be supported by the second supporting surfaces 1022 of the end portion members 102 of the case portion 100. For example, in the present embodiment, the substrate 105 is fixed to the sensor housing 106 to be supported by the second supporting surfaces 1022 via the sensor housing 106.

The substrate 105 may be made of a nonmetal material so as not to negatively affect the magnetic sensors 11. For example, the substrate 105 may be made of any resin such as polyimide or polyester.

[3-6. Sensor housing 106] The sensor housing 106 is a tubular member that protects each of the magnetic sensors 11, the ultrasonic sensors 12, and the temperature sensors 13, and has an inner circumference surface on which the substrate 105 is fixed. The sensor housing 106 may extend in the longitudinal direction z of the pipeline P, and be in contact with the second supporting surfaces 1022 over the entire circumference of the end portion members 102. The distance between the sensor housing 106 and the case portion main body 103 (that is, the thickness of a layer of the liquid 101 more on the outer side than the sensor housing 106) may be 10 mm. In the figure, the sensor housing 106 divides the internal space 1000 into the inner circumference side and the outer circumference side. Still, the liquid 101 may be flowable between these sides via through holes (not shown) formed in the sensor housing 106 and the substrate 105.

The sensor housing 106 may be made of a nonmetal material so as not to negatively affect the magnetic sensors 11. For example, the sensor housing 106 may be made of a thermoplastic resin such as polyether ether ketone (PEEK). The sensor housing 106 may have a thickness of 10 mm, for example.

The inner circumference surface or the outer circumference surface of the sensor housing 106 may be provided with a plate-shaped magnetic shield that magnetically isolates each of the magnetic sensors 11 from the case portion main body 103. The magnetic shield may be formed of Mu-metal having a thickness of 1 mm, for example.

In the sensor device 1 described above, the plurality of magnetic sensors 11 are provided to face the outer circumference surface P1 of the pipeline P. Thus, the intensity distribution of the magnetic field leaking from the pipeline P toward the outer circumference side, and thus the relative thickness distribution can be calculated from the measurement results from the magnetic sensors 11. Furthermore, the ultrasonic sensors 12 are provided to measure the thickness of the pipeline P in the measurement region of the magnetic sensors 11. Thus, the absolute thickness of the pipeline P in the magnetic field measurement region can be measured. With a combination of the measurement results from the ultrasonic sensors 12 and the magnetic sensors 11, a relationship between the absolute thickness and the relative thickness at the measurement position of the ultrasonic sensors 12 can be calculated. Thus, the absolute thickness distribution of the pipeline P can be accurately calculated.

The sensor device 1 is provided with one or a plurality of temperature sensors 13, so that measurement error can be reduced through temperature compensation, when the measurement results from the magnetic sensors 11 and the ultrasonic sensors 12 are affected by the temperature of the measurement environment. The temperature sensors 13 are disposed in the vicinity of the respective ultrasonic sensors 12, so that the measurement error of the ultrasonic sensors 12 can be reliably reduced.

The number of ultrasonic sensors 12 is smaller than the number of magnetic sensors 11. Thus, the measurement can be performed with power consumption smaller than that in a case where the absolute thickness distribution is mainly measured by the ultrasonic sensors 12.

Furthermore, the measurement interval of the ultrasonic sensors 12 is longer than the measurement interval of the magnetic sensors 11. Thus, the power consumption of the sensor device 1 can be reliably reduced.

The magnetic sensors 11, the ultrasonic sensors 12, and the temperature sensors 13 are provided inside the insulating liquid 101, and thus can be prevented from corrosion. Even when the pipeline P is disposed in a high pressure environment such as the deep sea, the sensors can be protected by maintaining the internal pressure of the case portion 100.

The liquid 101 is interposed between the outer circumference surface P1 of the pipeline P and each of the magnetic sensors 11, the ultrasonic sensors 12, and the temperature sensors 13. Thus, the sensors are prevented from breaking even when the pipeline P is deflected. The liquid 101 serves as an ultrasonic-wave transmitting medium, so that the absolute thickness of the pipeline P can be reliably measured.

The end portion members 102 of the case portion 100 are each provided with the annular first supporting surface 1021 and the annular second supporting surface 1022. The annular first supporting surface 1021 is provided on the corresponding end side in the longitudinal direction z and supports the case portion main body 103. The annular second supporting surface 1022 is provided more on the center side in the longitudinal direction z and is closer to the outer circumference surface P1 of the pipeline P than the first supporting surface 1021 and supports the substrate 105. Thus, the magnetic sensors 11, the ultrasonic sensors 12, and the temperature sensors 13 can be reliably disposed in the liquid 101, while being separated from the outer circumference surface P1 of the pipeline P and the inner circumference surface of the case portion main body 103. Thus, the sensors can be reliably prevented from breaking even when the pipeline P deflects.

The substrate 105 is a flexible substrate and thus can be easily bent to face around the outer circumference surface P1 of the pipeline P.

The substrate 105 is fixed to the inner circumference surface of the tubular sensor housing 106. Thus, each of the magnetic sensors 11, the ultrasonic sensors 12, and the temperature sensors 13 can be more reliably prevented from breaking due to the deflection of the pipeline P. Furthermore, the magnetic sensors 11, the ultrasonic sensors 12, and the temperature sensors 13 can be positioned with respect to the outer circumference surface P1 of the pipeline P, to be separated from the outer circumference surface P1 of the pipeline P by a uniform distance.

Figure 2:
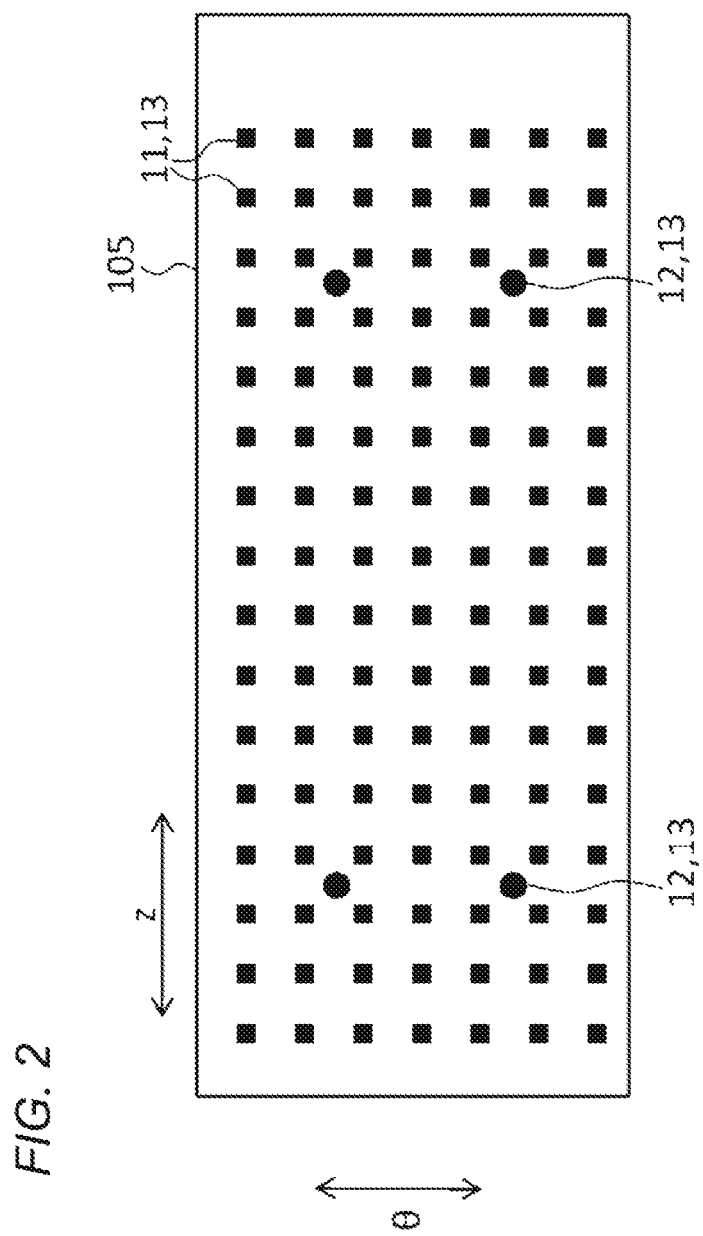
FIG. 2 shows magnetic sensors 11 and ultrasonic sensors 12 disposed on a tubular substrate 105.

[4. Arrangement of magnetic sensors 11, ultrasonic sensors 12, and temperature sensors 13] FIG. 2 shows the magnetic sensors 11, the ultrasonic sensors 12, and the temperature sensors 13 disposed on the tubular substrate 105.

For example, in the present embodiment, the substrate 105 may have a length of 500 mm in the longitudinal direction z. The substrate 105 may have an outer diameter (diameter) that is larger than the outer diameter of the pipeline P (323.8 mm, for example) by 20 mm. The magnetic sensors 11 may be arranged at an equal interval along each of the circumference direction θ and the longitudinal direction z of the pipeline P. For example, the distance between adjacent magnetic sensors 11 may be 40 mm. Four ultrasonic sensors 12 may be arranged at an equal interval along the circumference direction θ of the pipeline P and two ultrasonic sensors 12 may be arranged at an equal interval along the longitudinal direction z. The ultrasonic sensors 12 may each be arranged at a position not overlapping with any of the magnetic sensors 11. The temperature sensors 13 may each be arranged in the vicinity of a corresponding one of the magnetic sensors 11 and the ultrasonic sensors 12. In the figure, the temperature sensors 13 are each shown to be integrated with a corresponding one of the magnetic sensors 11 and the respective ultrasonic sensors 12.

Figure 3:
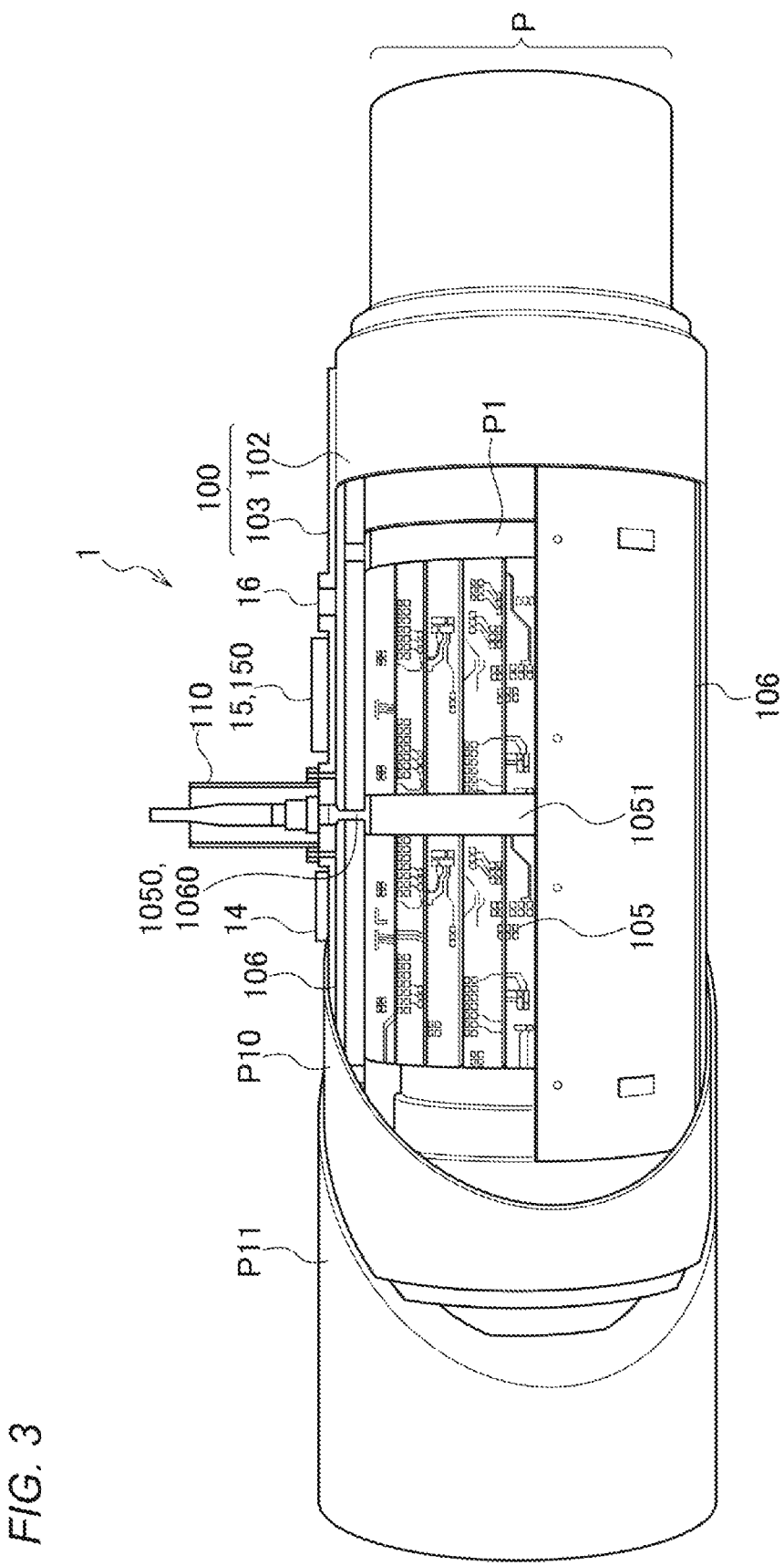
FIG. 3 is a partial transparent view of the sensor device 1.

[5. Other configuration of sensor device 1] FIG. 3 is a partial transparent view of the sensor device 1. The sensor device 1 may further include a connector 110, a transmission unit 14, a power supply unit 15, and a liquid injection port 16.

[5-1. Connector 110] The connector 110 is provided through the case portion 100 and electrically connected to the substrate 105. For example, the connector 110 may be formed through the case portion main body 103 of the case portion 100. For example, in the present embodiment, the sensor housing 106 is provided with a through hole 1060, and a terminal 1050 of the substrate 105 may be inserted through the through hole 1060. The terminal 1050 may be electrically connected to each of the magnetic sensors 11, the ultrasonic sensors 12, and the temperature sensors 13. The connector 110 is electrically connected to the substrate 105 via the terminal 1050. The connector 110 may be electrically connected to the transmission unit 14 and the power supply unit 15 outside the case portion 100.

[5-2. Transmission unit 14] The transmission unit 14 is provided outside the case portion 100, and transmits measurement data from each of the magnetic sensors 11, the ultrasonic sensors 12, and the temperature sensors 13. The transmission unit 14 may transmit the data through wired communications, or through wireless communications.

When the transmission unit 14 transmits the data through wired communications, the sensor devices 1 provided to the pipeline P may be connected to a calculation device 6 (shown in FIG. 7) and a relay device through a communication cable. When the transmission unit 14 transmits the data through wireless communications, an unmanned submarine may cruise around the sensor devices 1 to collect the data.

[5-3. Power supply unit 15] The power supply unit 15 supplies power to the components of the sensor device 1 including the magnetic sensors 11, the ultrasonic sensors 12, the temperature sensors 13, and the transmission unit 14 in the present embodiment. The power supply unit 15 may supply power obtained by energy harvesting.

For example, the power supply unit 15 may generate power through temperature difference power generation utilizing a temperature difference between the temperature of the fossil fuel flowing in the pipeline P (for example, a natural resource in the present embodiment) and the temperature of the environment outside the pipeline P (for example, underwater temperature in the present embodiment). For example, the internal temperature of the natural resource may be about 40 to 100° C., whereas the underwater temperature may be about 2° C.

The power supply unit 15 may include a thermoelectric element 150 that converts thermal energy into power energy and a battery (not shown) that stores the power energy thus generated. The thermoelectric element 150 may be provided to be in contact with the outer circumference surface P1 of the pipeline P and the sea water outside the pipeline P. The thermoelectric element 150 may be in contact with the outer circumference surface P1 of the pipeline P via the case portion main body 103 and the end portion members 102 or the liquid 101. When the corrosion resistance layer P10 and the thermal insulation layer P11 are provided on the outer circumference of the pipeline P, the thermoelectric element 150 may be exposed from these layers.

[5-4. Liquid injection port 16] The liquid injection port 16 is formed through the case portion 100. For example, the liquid injection port 16 may be formed through the case portion main body 103. The liquid injection port 16 is used for injecting the liquid 101 into the internal space 1000 of the case portion 100.

In the sensor device 1, the transmission unit 14, connected to the substrate 105 via the connector 110, is provided outside the case portion 100. Thus, the measurement data can be reliably transmitted while protecting each of the magnetic sensors 11, the ultrasonic sensors 12, and the temperature sensors 13 with the case portion 100.

With the power supply unit 15 that performs the temperature difference power generation provided, the measurement can be performed without supplying power to the sensor device 1 from the external.

In FIG. 3, a supporting band 1051 extending in the circumference direction θ may be provided at a center portion of the substrate 105 in the longitudinal direction z. The supporting band 1051 may be fixed to the inner circumference surface of the sensor housing 106 over the entire circumference direction θ, so that a uniform distance between the substrate 105 and the outer circumference surface P1 of the pipeline P can be maintained.

Figure 4:
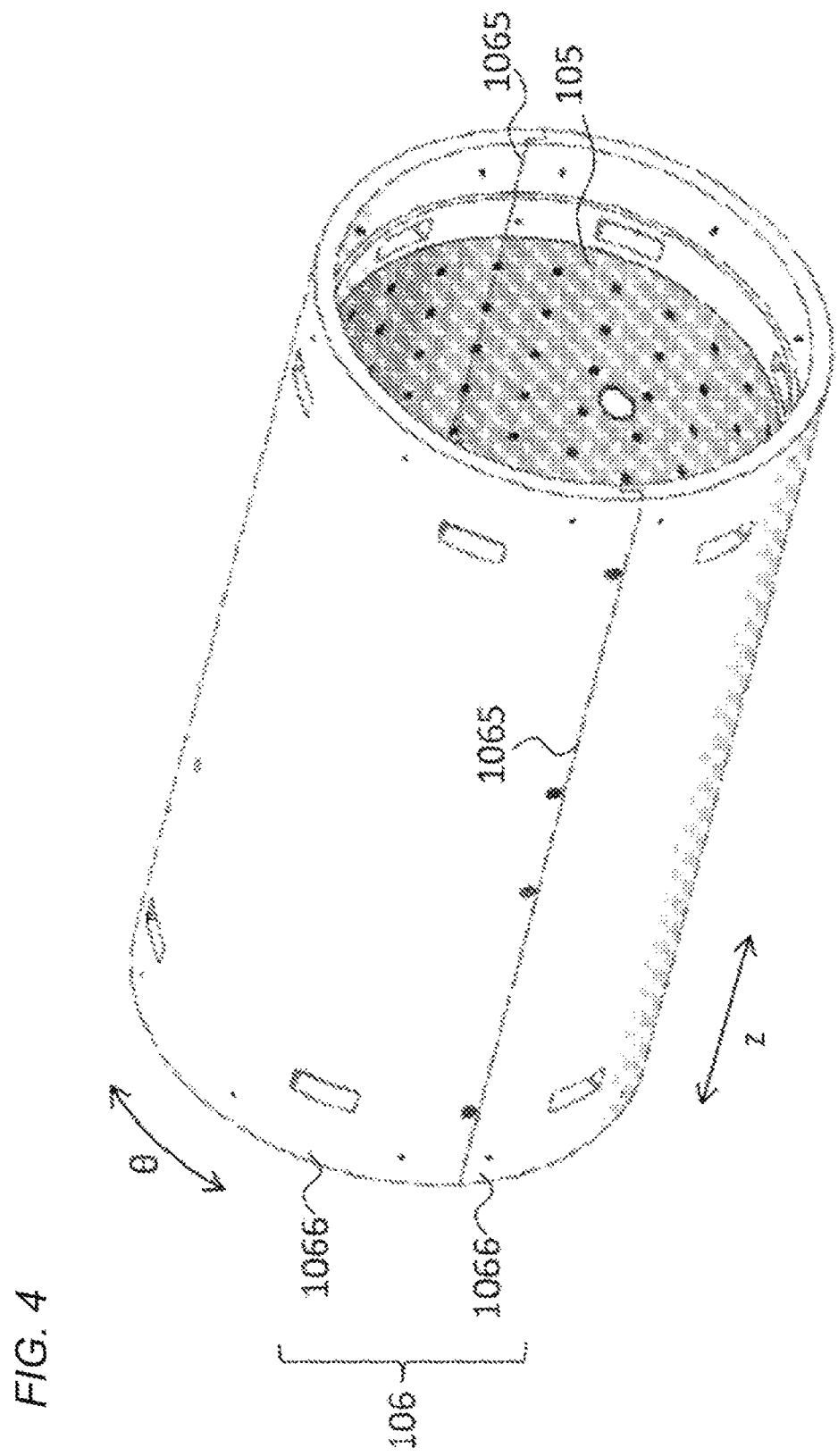
FIG. 4 shows a sensor housing 106.

[6. Sensor housing 106] FIG. 4 shows the sensor housing 106. The sensor housing 106 has at least one seam 1065 extending in the longitudinal direction z. For example, in the present embodiment, the sensor housing 106 has two seams 1065.

The sensor housing 106 described above has the seams 1065 extending in the longitudinal direction z, and thus is formed with at least two segments 1066 joined to each other in the circumference direction θ. Thus, the substrate 105 can be easily fixed to the inner circumference surface of the tubular sensor housing 106.

Figure 5:
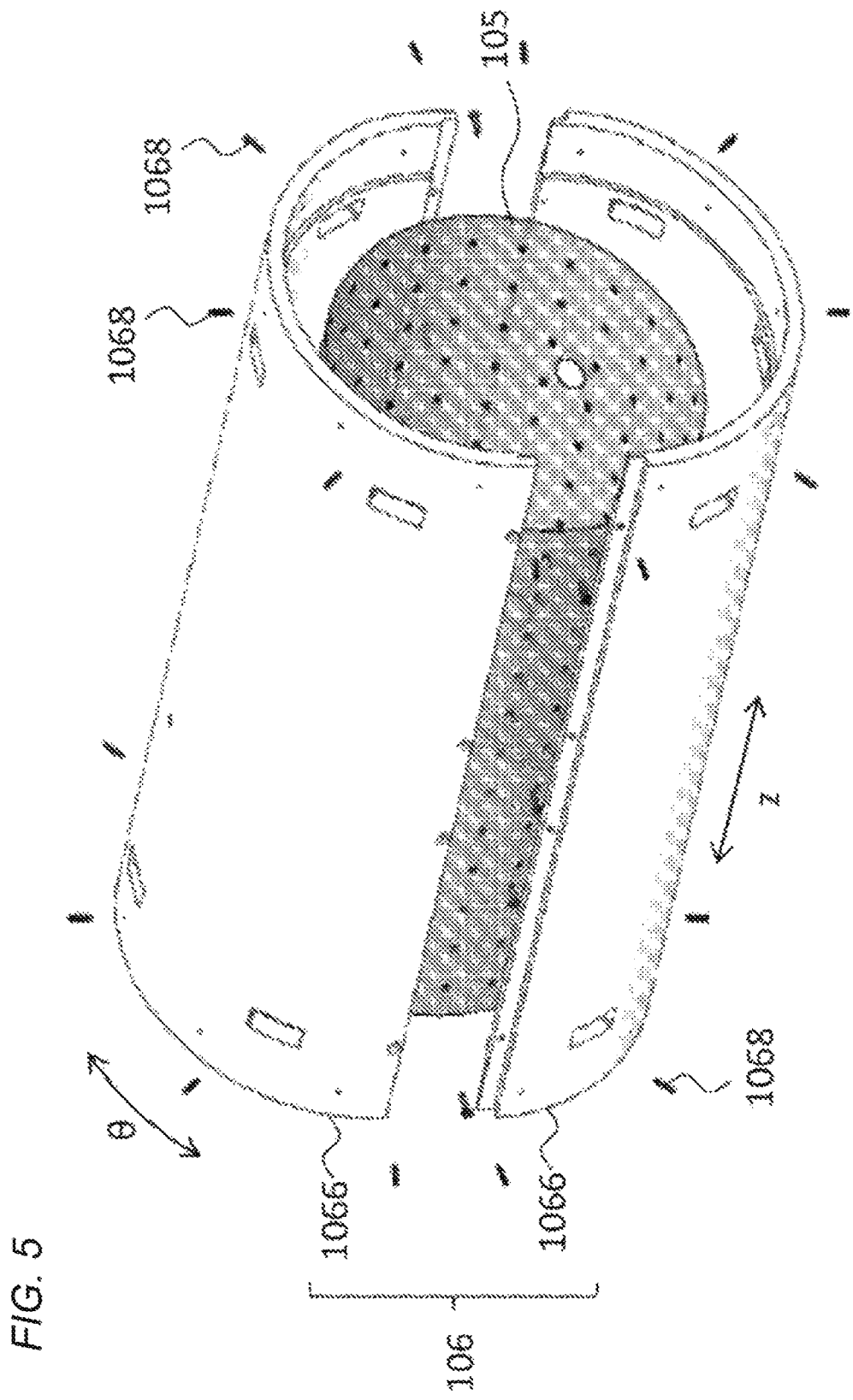
FIG. 5 shows the sensor housing 106 before the joining.

FIG. 5 shows the sensor housing 106 before the joining. The sensor housing 106 may include a plurality of segments 1066 joined to each other in the circumference direction θ.

For example, in the present embodiment, the sensor housing 106 is formed by: bringing the segments 1066, with the inner side surfaces to which the substrate 105 is fixed, in contact with each other around the pipeline P; and fixing the segments 1066 to the second supporting surfaces 1022 of the end portion members 102 of the case portion 100 using a plurality of headless screws 1068. Note that the sensor housing 106 may be formed by joining the sensor segments 1066 to each other.

Figure 6:
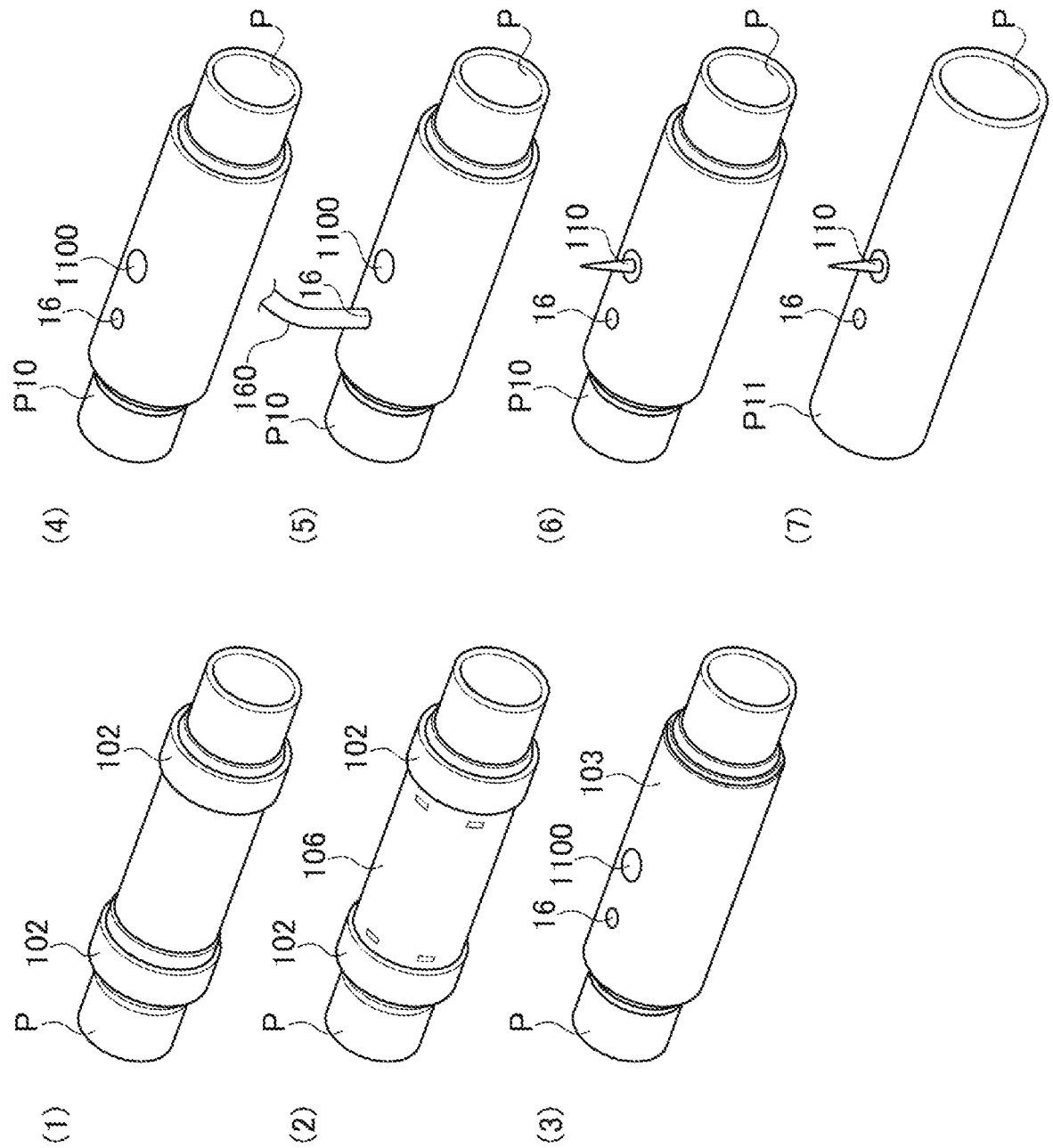
FIG. 6 shows a method of attaching the sensor device 1.

[7. Method of attaching sensor device 1] FIG. 6 shows a method of attaching the sensor device 1. The sensor device 1 may be attached to the pipeline P through steps shown in Section (1) to Section (7) in the figure.

First of all, as shown in Section (1), the end portion members 102 of the case portion 100 are fixed to the outer circumference surface P1 of the pipeline P. For example, the end portion members 102 may be welded to the outer circumference surface P1 of the pipeline P.

Then, as shown in Section (2), the sensor housing 106 is attached between the end portion members 102. As shown in FIG. 5, the sensor housing 106 may be fixed to the second supporting surfaces 1022 of the end portion members 102 by using the headless screws 1068. The substrate 105 to which the magnetic sensors 11 and the ultrasonic sensors 12 are disposed may be fixed to the inner side of the sensor housing 106.

Then, as shown in Section (3), the case portion main body 103 is fixed to the first supporting surfaces 1021 of the end portion member 102. For example, the case portion main body 103 may be welded to the first supporting surfaces 1021. In this step, the case portion main body 103 is provided with a connector port 1100 through which the connector 110 is inserted.

Then, as shown in Section (4), the corrosion resistance layer P10 is provided on the outer circumferences of the pipeline P and the case portion 100. Next, as shown in Section (5), the internal space 1000 of the case portion 100 is filled with the liquid 101 from an injection tube 160 through the liquid injection port 16.

Next, as shown in Section (6), the connector 110 is inserted through the connector port to be connected to the substrate 105. Then, as shown in Section (7), the thermal insulation layer P11 is provided on the outer circumferences of the pipeline P and the case portion 100.

Figure 7:
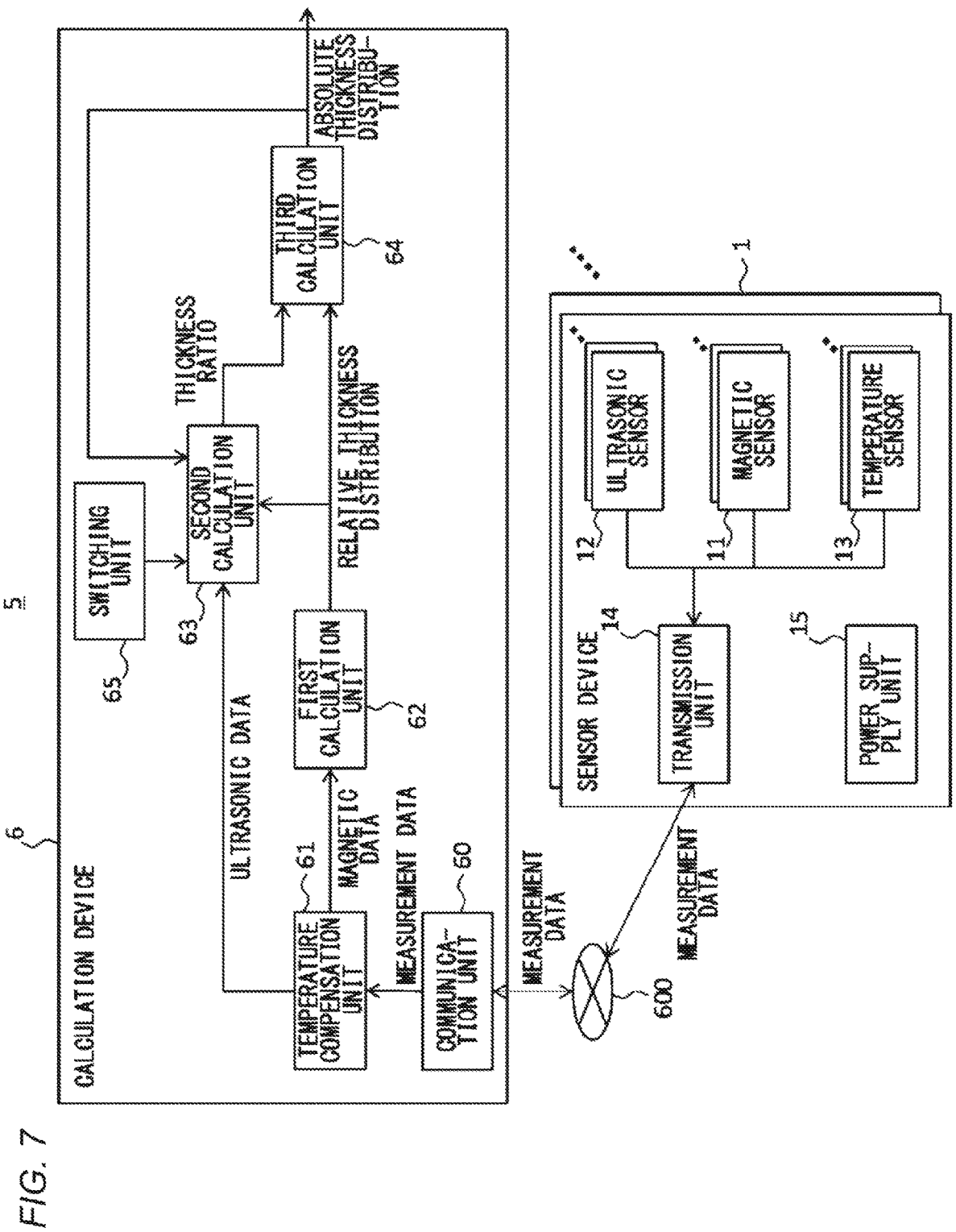
FIG. 7 shows a pipeline monitoring system 5.

[8. Pipeline monitoring system 5] FIG. 7 shows a pipeline monitoring system 5. The pipeline monitoring system 5 monitors the corrosion of the pipeline P, and includes the plurality of sensor device 1 attached to the pipeline P and the calculation device 6.

[8-1. Calculation device 6] The calculation device 6 calculates a thickness distribution of the pipeline P in a mounted region of each of the sensor devices 1, based on the measurement result from the sensor device 1. The calculation device 6 includes a communication unit 60, a temperature compensation unit 61, a first calculation unit 62, a second calculation unit 63, a third calculation unit 64, and a switching unit 65.

[8-1-1. Communication unit 60] The communication unit 60 receives the measurement data from each of the sensor devices 1. For example, the communication unit 60 may be capable of communicating with each of the sensor devices 1 through a network 600 (for example, the Internet or a dedicated line). The communication unit 60 may supply the measurement data thus received to the temperature compensation unit 61.

[8-1-2. Temperature compensation unit 61] The temperature compensation unit 61 performs temperature compensation on the measurement result from the sensor device 1. For example, the temperature compensation unit 61 may perform the temperature compensation on the measurement data indicating the measurement result from each of the magnetic sensors 11 (also referred to as magnetic field data) and the measurement data indicating the measurement result from the each of the ultrasonic sensors 12 (also referred to as ultrasonic data) among the received measurement data, based on the measurement data indicating the measurement result from each of the temperature sensors 13 (also referred to as temperature data). For example, the temperature compensation unit 61 may store in advance a table or the like indicating association among the temperature of the measurement environment and the properties of the magnetic sensors 11 and the ultrasonic sensors 12, and perform the temperature compensation by using the table.

The magnetic field data, the ultrasonic data, and the temperature data may include identification information on the sensors that have measured the data. The calculation device 6 may store in advance a table indicating association between the identification information on each of the magnetic sensors 11 and the ultrasonic sensors 12 and the identification information on the temperature sensor 13 disposed in the vicinity of the sensors. The temperature compensation unit 61 may perform the temperature compensation by using the temperature of each of the magnetic sensors 11 as the temperature of the temperature sensor 13 in the vicinity of the magnetic sensor 11. Similarly, the temperature compensation unit 61 may perform the temperature compensation by using the temperature of each of the ultrasonic sensors 12 as the temperature of the temperature sensor 13 in the vicinity of the ultrasonic sensor 12. The calculation device 6 may store in advance an arrangement table associating in advance the identification information on each sensor and a position of the sensor in the sensor device 1 (for example, a position in a cylindrical coordinate system in the present embodiment). When the number of the temperature sensors 13 is different from the number of the magnetic sensors 11 and the ultrasonic sensors 12, the temperature compensation unit 61 may use the arrangement table to calculate the temperature distribution in the measurement region based on the measurement results from the plurality of temperature sensors 13 and determine the temperature of each of the magnetic sensors 11 and the ultrasonic sensors 12.

The temperature compensation unit 61 may supply the magnetic field data after the temperature compensation to the first calculation unit 62. The temperature compensation unit 61 may supply the ultrasonic data after the temperature compensation to the second calculation unit 63. Note that the temperature compensation unit 61 may not be provided to the calculation device 6. In such a case, the communication unit 60 may supply the magnetic field data and the ultrasonic data, in the received measurement data, respectively to the first calculation unit 62 and the second calculation unit 63.

[8-1-3. First calculation unit 62] The first calculation unit 62 calculates the relative thickness distribution in the measurement region of the plurality of magnetic sensors 11 based on the magnetic field data from each of the magnetic sensors 11.

For example, the first calculation unit 62 may use the arrangement table described above to determine the magnetic field intensity obtained from each of the magnetic sensors 11 as the magnetic field intensity at the measurement position of the magnetic sensor 11, to calculate the magnetic field intensity distribution on the outer circumference surface P1 of the pipeline P. The first calculation unit 62 may calculate the relative thickness distribution based on the magnetic field intensity distribution thus calculated. The first calculation unit 62 may supply the relative thickness distribution thus calculated to the second calculation unit 63 and the third calculation unit 64.

[8-1-4. Second calculation unit 63] The second calculation unit 63 calculates a value of ratio between the absolute thickness of the pipeline P and the relative thickness in the relative thickness distribution (also referred to as a thickness ratio). This absolute thickness means a thickness that is not a relative value but an absolute value. The second calculation unit 63 may calculate the thickness ratio based on the ultrasonic data from each of the ultrasonic sensors 12 and the relative thickness obtained at the measurement position of the ultrasonic sensor 12 in the relative thickness distribution obtained by the first calculation unit 62. The second calculation unit 63 may supply the thickness ratio thus calculated to the third calculation unit 64. For example, for each of the ultrasonic sensors 12, the second calculation unit 63 may calculate the thickness ratio at the position of the ultrasonic sensor 12, and supply the thickness ratio to the third calculation unit 64.

[8-1-5. Third calculation unit 64] The third calculation unit 64 calculates the absolute thickness distribution of the pipeline P in the measurement region, based on the thickness ratio and the relative thickness distribution. For example, the third calculation unit 64 may multiply the relative thickness at one position in the relative thickness distribution by the value of ratio of the absolute thickness to the relative thickness, to calculate the absolute thickness at the position. The third calculation unit 64 may multiply the relative thickness at each position by the thickness ratio at the position of the ultrasonic sensor 12 in the vicinity of the position (the closest ultrasonic sensor 12, for example), to calculate the absolute thickness at each position. The third calculation unit 64 may calculate the absolute thickness at each position of the pipeline P to calculate the absolute thickness distribution of the pipeline P. The third calculation unit 64 may output the thickness distribution thus calculated to the outside. The third calculation unit 64 may also output the thickness distribution calculated to the second calculation unit 63.

[8-1-6. Switching unit 65] The switching unit 65 outputs a signal for instructing switching of calculation processing to the second calculation unit 63. Calculation processing after the switching will be described in detail later.

The switching unit 65 may output the signal when a magnetization state of the pipeline P changes, and may output the signal when pigging is performed on the pipeline P, for example. For example, the switching unit 65 may output the signal in response to reception of a pigging completion notification from a pigging control device (not shown), or may output the signal in response to an operation from an operator that has received a pigging completion report. This pigging may be a practice of performing maintenance and thickness measurement on the pipeline P with a device known as pigs inserted into the pipeline P. The pigs may be magnetized, and thus may change the magnetization state of the pipeline P. The magnetization of the pigs may be too weak to directly affect the magnetic sensors 11.

With the calculation device 6 described above, the thickness distribution of the pipeline P in the mounted region of each of the sensor devices 1 is calculated based on the measurement result from the sensor device 1, whereby thinning of the pipeline P can be detected and maintenance can be performed therefor swiftly.

Furthermore, the relative thickness distribution in the measurement region is calculated based on the measurement result from each of the magnetic sensors 11. The value of ratio between the absolute thickness and the relative thickness is calculated based on the measurement result from the ultrasonic sensors 12 and the relative thickness obtained at the measurement position in the relative thickness distribution. The absolute thickness distribution in the measurement region is calculated based on the value of ratio and the relative thickness distribution. Thus, the absolute thickness distribution of the pipeline P can be reliably calculated.

Figure 8:
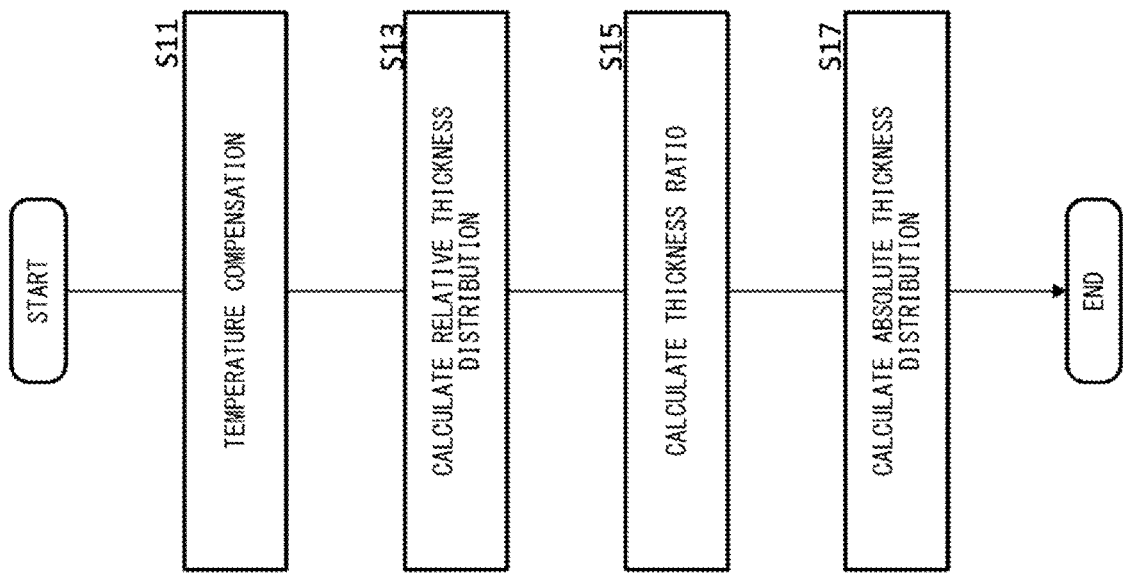
FIG. 8 shows a method of calculating an absolute thickness distribution.

[8-2. Method of calculating thickness distribution] FIG. 8 shows a method of calculating the absolute thickness distribution. The calculation device 6 calculates the absolute thickness distribution through processing in steps S11 to S17. For example, in the present embodiment, each of the sensor devices 1 transmits the measurement result from each of the magnetic sensors 11 to the calculation device 6 at an interval shorter than the transmission interval of the measurement result from each of the ultrasonic sensors 12. Each of the temperature sensors 13 transmits the measurement results to the calculation device 6 at the same interval as the transmission interval of the measurement result from the magnetic sensor 11 or the ultrasonic sensor 12 in the vicinity of the temperature sensor 13.

In step S11, the temperature compensation unit 61 performs the temperature compensation on the measurement result from the sensor device 1. For example, in the present embodiment, the temperature sensors 13 are disposed in the vicinity of the respective magnetic sensors 11 and the respective ultrasonic sensors 12. The temperature compensation unit 61 performs the temperature compensation on the measurement result from each of the magnetic sensors 11 and the ultrasonic sensors 12 by using the measurement temperature from the corresponding temperature sensor 13.

In step S13, the first calculation unit 62 calculates the relative thickness distribution in the measurement region of each of the sensor device 1. The first calculation unit 62 may calculate the relative thickness distribution through a method disclosed in Japanese Patent No. 6447641.

For example, the first calculation unit 62 may calculate a three-dimensional magnetic field intensity distribution (in the longitudinal direction z, the circumference direction θ, and the radial direction r of the pipeline P in the present embodiment, for example) based on the magnetic field data from each of the magnetic sensors 11. The first calculation unit 62 may calculate a magnetic dipole density distribution in the measurement region based on the magnetic field intensity distribution, and calculate the relative thickness distribution (also referred to as a thinning distribution) in the measurement region based on the magnetic dipole density distribution.

When the magnetic dipole density distribution is calculated, the first calculation unit 62 may calculate the magnetic dipole density distribution in the z direction in the measurement region, based on the magnetic flux density in the z direction measured by each of the magnetic sensors 11 and the magnetization amount in each of the z direction, the θ direction, and the r direction in the measurement region. Similarly, the first calculation unit 62 may calculate the magnetic dipole density distribution in the θ direction in the measurement region, based on the magnetic flux density in the θ direction measured by each of the magnetic sensors 11 and the magnetization amount in each of the z direction, the θ direction, and the r direction in the measurement region. Similarly, the first calculation unit 62 may calculate the magnetic dipole density distribution in the r direction in the measurement region, based on the magnetic flux density in the r direction measured by each of the magnetic sensors 11 and the magnetization amount in each of the z direction, the θ direction, and the r direction in the measurement region.

When the relative thickness distribution is calculated based on the magnetic dipole density distribution, the first calculation unit 62 may calculate the relative thickness distribution based on the magnetic dipole density distributions in the z direction, the θ direction, and the r direction, or may calculate the relative thickness distribution based on information obtained by averaging the distributions.

In step S15, the second calculation unit 63 calculates the thickness ratio. The second calculation unit 63 may calculate the thickness ratio based on the absolute thickness most recently obtained for a position and the relative thickness most recently obtained for the position. For example, the second calculation unit 63 may calculate the thickness ratio based on the measurement result most recently obtained by each of the ultrasonic sensors 12 (the absolute thickness at the measurement position of the ultrasonic sensor 12) and the relative thickness obtained at the measurement position in the relative thickness distribution most recently calculated by the first calculation unit 62. The second calculation unit 63 may calculate the thickness ratio based on the absolute thickness at any position in the absolute thickness distribution most recently calculated by the third calculation unit 64, and the relative thickness obtained at the position in the relative thickness distribution most recently calculated by the first calculation unit 62. The term "most recently" indicates closeness in terms of time, and may be the time point closest to the current time point, for example.

When the magnetization state of the pipeline P changes, the second calculation unit 63 may switch the calculation processing for the thickness ratio in response to the signal supplied from the switching unit 65. Thus, the second calculation unit 63 may calculate the thickness ratio based on the measurement result most recently obtained by each of the ultrasonic sensors 12 (the absolute thickness at the measurement position of the ultrasonic sensor 12) and the relative thickness obtained at the measurement position of the ultrasonic sensor in the relative thickness distribution newly calculated by the first calculation unit 62 after the second calculation unit 63 has received the signal. The second calculation unit 63 may calculate the thickness ratio based on the absolute thickness at any position in the absolute thickness distribution most recently calculated by the third calculation unit 64 and the relative thickness obtained for the position in the relative thickness distribution newly calculated by the first calculation unit 62 after the second calculation unit 63 has received the signal.

Then, in step S17, the third calculation unit 64 calculates the absolute thickness distribution of the pipeline P in the measurement region based on the thickness ratio and the relative thickness distribution.

With the calculation device 6 described above, the thickness ratio is calculated based on the measurement result most recently obtained from each of the ultrasonic sensors 12 and the relative thickness calculated most recently at the measurement position of the ultrasonic sensor 12, or based on the absolute thickness most recently calculated at any position and the relative thickness most recently calculated at the position. Thus, the absolute thickness distribution can be calculated by calculating the thickness ratio, even when the measurement result cannot be acquired from the ultrasonic sensors 12.

Furthermore, in response to the reception of the signal from the switching unit 65, the thickness ratio is calculated based on the measurement result most recently obtained by each of the ultrasonic sensors 12 and the relative thickness newly measured at the measurement position of the ultrasonic sensor 12 after the reception of the signal, or is calculated based on the absolute thickness at any position most recently calculated and the relative thickness newly calculated at the position after the reception of the signal. Thus, even when the magnetization state of the pipeline P changes after the pigging in the pipeline P or the like, the thickness ratio is recalculated and thus the absolute thickness distribution can be accurately calculated.

[9. Modifications] The magnetic sensors 11 and the ultrasonic sensors 12 described to be disposed in the liquid 101 in the above-described embodiment may be disposed in the liquid 101 while being in indirect contact with the liquid 101. For example, at least one kind of sensors of the magnetic sensors 11 or the ultrasonic sensors 12 or the entirety of the sensors and the substrate 105 may be disposed in the liquid 101 while being sealed in resin not affecting the measurement result. For example, epoxy, urethane, silicon, or the like may be used as this resin.

The liquid 101 described to be interposed between the ultrasonic sensor 12 and the outer circumference surface P1 of the pipeline P may not be interposed therebetween. For example, the ultrasonic sensor 12 may be in direct contact with the outer circumference surface P1 or may be in indirect contact with the outer circumference surface P1 via adhesive or buffer agent.

The measurement interval of the ultrasonic sensor 12 described to be longer than the measurement interval of the magnetic sensor 11 may be the same as or shorter than the measurement interval of the magnetic sensor 11. The sensor device 1 described to transmit the measurement result from each of the magnetic sensors 11 to the calculation device 6 at an interval shorter than a transmission interval of the measurement result from each of the ultrasonic sensors 12, may transmit the measurement results from magnetic sensors 11 and the ultrasonic sensors 12 at the same interval or may transmit the measurement result from the magnetic sensors 11 to the calculation device 6 at an interval longer than a transmission interval of the measurement result from the ultrasonic sensors 12. The power consumption of the ultrasonic sensor 12 for the measurement described to be larger than the power consumption of the magnetic sensor 11 may be the same as or smaller than the power consumption of the magnetic sensor 11.

Also, various embodiments according to the present invention may be described with reference to flow charts and block diagrams. Blocks herein may illustrate (1) steps of processes of executing operations or (2) sections in a device responsible for executing operations. Particular steps and sections may be implemented by a dedicated circuitry, a programmable circuitry that is supplied together with computer-readable instructions stored on a computer-readable medium, or by a processor that is supplied together with computer-readable instructions stored on a computer-readable medium. The dedicated circuitry may include digital or analog hardware circuits. It may also include integrated circuits (IC) or discrete circuits. The programmable circuitry may include reconfigurable hardware circuits that include a logical AND, a logical OR, a logical XOR, a logical NAND, a logical NOR, other logical operations, a flip-flop, a register, and memory elements such as a field-programmable gate array (FPGA) and a programmable logic array (PLA).

The computer-readable medium may include any tangible device that can store instructions to be executed by an appropriate device. As a result, the computer-readable medium having the instructions stored on the device incorporates a product including instructions that can be executed in order to create means for executing operations specified in the flow charts or the block diagrams. Examples of the computer-readable medium may include: an electronic storage medium; a magnetic storage medium; an optical storage medium; an electromagnetic storage medium; and a semiconductor storage medium. More specific examples of computer-readable media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY (registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

The computer-readable instruction may be provided to a processor of general purpose computer, a special purpose computer, another programmable a data-processing device, or to a programmable circuitry, locally, via local area network (LAN), or wide area network (WAN) such as the Internet. The computer-readable instruction may be executed in order to create means for executing operations specified by the flow charts or block diagrams. Examples of processors include computer processors, processing units, microprocessors, digital signal processors, controllers, microcontrollers, etc.

Figure 9:
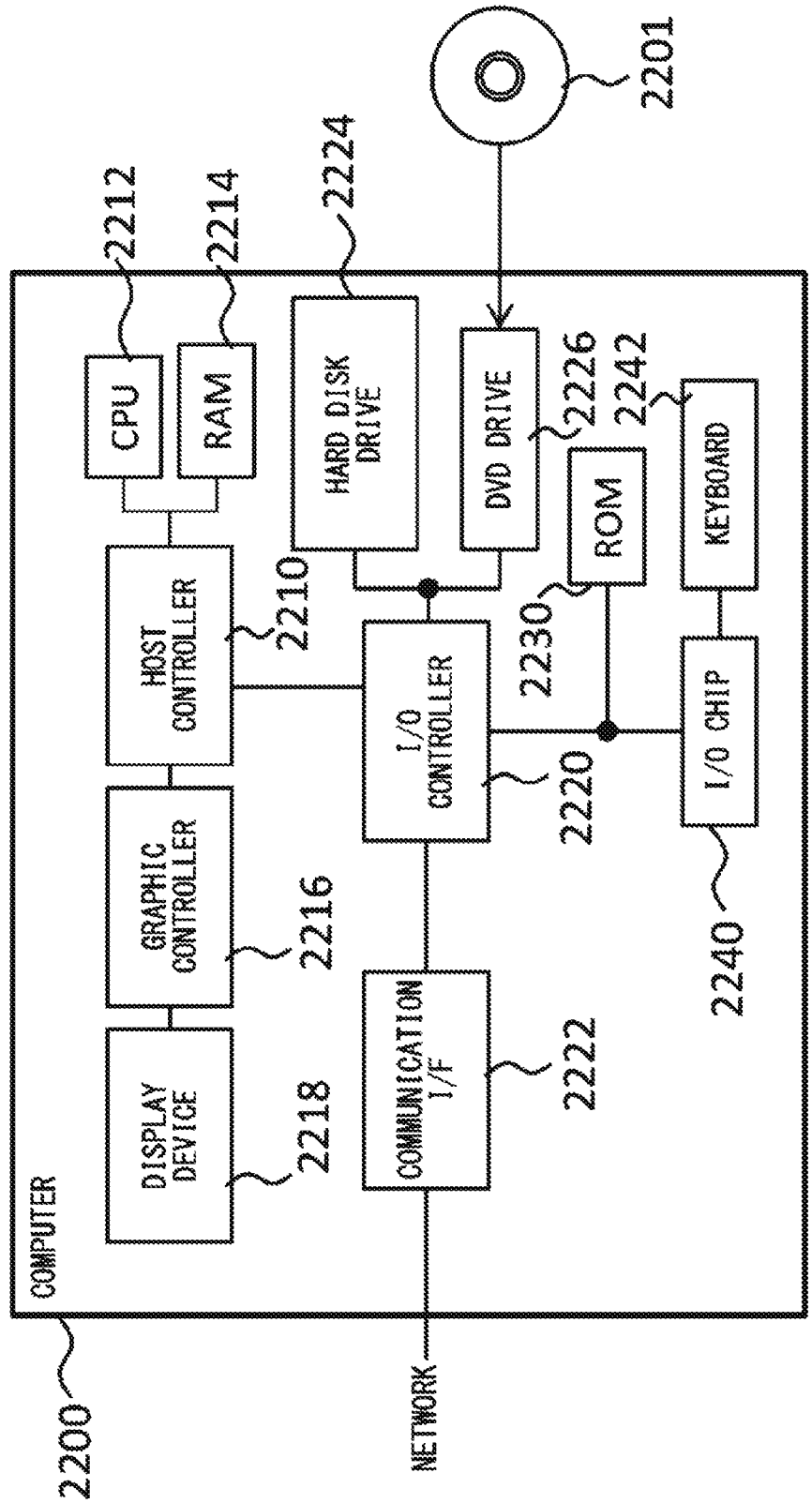
FIG. 9 shows an exemplary computer 2200 in which a plurality of aspects of the present invention may be embodied wholly or partially.

FIG. 9 shows an exemplary computer 2200 in which a plurality of aspects of the present invention may be embodied wholly or partially. A program that is installed in the computer 2200 can cause the computer 2200 to function as or perform operations associated with apparatuses of the embodiments of the present invention or one or more sections thereof, or cause the computer 2200 to perform processes of the embodiments of the present invention or steps thereof. Such programs may be executed by a CPU 2212 in order to cause the computer 2200 to execute particular operations associated with some or all of the flow charts and the blocks of the block diagrams described herein.

The computer 2200 according to the present embodiment includes the CPU 2212, a RAM 2214, a graphics controller 2216, and a display device 2218, and they are connected to each other with a host controller 2210. The computer 2200 also include input/output units such as a communication interface 2222, a hard disk drive 2224, a DVD-ROM drive 2226, and an IC card drive, and they are connected to the host controller 2210 via an input/output controller 2220. The computer also includes legacy input/output units such as a ROM 2230 and a keyboard 2242, and they are connected to the input/output controller 2220 via an input/output chip 2240.

The CPU 2212 operates according to programs stored in the ROM 2230 and the RAM 2214 and thereby controls each unit. The graphics controller 2216 acquires image data generated by the CPU 2212 on a frame buffer or the like provided in the RAM 2214, or in the graphics controller 2216, to display the image data on the display device 2218.

The communication interface 2222 communicates with another electronic device via network. The hard disk drive 2224 stores programs and data used by the CPU 2212 in the computer 2200. The DVD-ROM drive 2226 reads out programs or data from a DVD-ROM 2201 and provides the programs or data to the hard disk drive 2224 via the RAM 2214. The IC card drive reads out programs and data from an IC card or writes programs and data into the IC card.

The ROM 2230 stores therein a boot program and the like to be executed by the computer 2200 at the time of activation or a program that depends on hardware of the computer 2200. The input/output chip 2240 may also connect various input/output units to the input/output controller 2220 via a parallel port, a serial port, a keyboard port, a mouse port, or the like.

Programs are provided by a computer-readable medium such as the DVD-ROM 2201 or the IC card. The programs are read out from the computer-readable medium and installed on the hard disk drive 2224, the RAM 2214, or the ROM 2230, which are also examples of the computer-readable medium, to be executed by the CPU 2212. The information processing described in these programs is read out by the computer 2200 to provide linkage between the programs and the above-described various types of hardware resources. An apparatus or method may be constituted by realizing the operation or processing of information in accordance with the usage of the computer 2200.

For example, in a case where communication is executed between the computer 2200 and an external device, the CPU 2212 may execute a communication program loaded into the RAM 2214 and instructs the communication interface 2222 to implement the communication processing according to processing described in the communication program. Under control of the CPU 2212, the communication interface 2222 reads out transmission data stored in a transmission buffer processing region provided in a recording medium such as the RAM 2214, the hard disk drive 2224, the DVD-ROM 2201, or the IC card, and then sends the read transmission data to network or writes data received from the network into a reception buffer processing region provided in the recording medium or the like.

Also, the CPU 2212 may operate such that all or a necessary portion of a file or database stored on an external recording medium such as the hard disk drive 2224, the DVD-ROM drive 2226 (DVD-ROM 2201) or the IC card is read by the RAM 2214. Then, it may execute various types of processing on data in the RAM 2214. The CPU 2212 subsequently writes back the processed data to the external recording medium.

Various types of information such as various types of programs, data, tables, and databases may be stored on a recording medium, and then information processing may be performed on the information. On data read out from the RAM 2214, the CPU 2212 may execute various types of processing which include various types of operations, information processing, conditional judgement, conditional branch, unconditional branch, information searching/replacement, and the like as described throughout in the disclosure herein or specified by instruction sequences of programs. Then, the CPU 2212 writes back the result into the RAM 2214. Also, the CPU 2212 may search for information in files, database, or the like in a recording medium. For example, in a case where a recording medium stores a plurality of entries each having an attribute value of a first attribute associated with an attribute value of a second attribute, the CPU 2212 may search an entry, out of the plurality of entries, that has an attribute value of the first attribute matching a specified condition. Then, the CPU 2212 may read out an attribute value of the second attribute stored in the entry and acquire the attribute value of the second attribute associated with the first attribute that satisfies the predetermined condition.

The above-described programs or the software modules may be stored in a computer-readable medium in or near the computer 2200. Also, a recording medium such as a hard disk or a RAM provided in a server system that is connected to a dedicated communication network or the Internet can be used as the computer-readable medium, whereby a program is provided to the computer 2200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

1 sensor device, 5 pipeline monitoring system, 6 calculation device, 11 magnetic sensor, 12 ultrasonic sensor, 13 temperature sensor, 14 transmission unit, 15 power supply unit, 16 liquid injection port, 60 communication unit, 61 temperature compensation unit, 62 first calculation unit, 63 second calculation unit, 64 third calculation unit, 65 switching unit, 100 case portion, 101 liquid, 102 end portion member, 103 case portion main body, 105 substrate, 106 sensor housing, 110 connector, 150 thermoelectric element, 160 injection tube, 600 network, 1000 internal space, 1021 first supporting surface, 1022 second supporting surface, 1050 terminal, 1051 supporting band, 1060 through hole, 1065 seam, 1066 segment, 1068 headless screw, 1100 connector port, 2200 computer, 2201 DVD-ROM, 2210 host controller, 2212 CPU, 2214 RAM, 2216 graphics controller, 2218 display device, 2220 input/output controller, 2222 communication interface, 2224 hard disk drive, 2226 DVD-ROM drive, 2230 ROM, 2240 input/output chip, 2242 keyboard, P pipeline, P1 outer circumference surface, P10 corrosion resistance layer, P11 thermal insulation layer

The invention claimed is:

1. A sensor device comprising:
a plurality of magnetic sensors arranged to face an outer circumference surface of a pipeline;
ultrasonic sensors arranged to face the outer circumference surface and measure a thickness of the pipeline in a measurement region in which the plurality of magnetic sensors measure a magnetic field, a number of the ultrasonic sensors being less than a number of the plurality of magnetic sensors; and
a calculation unit, wherein the calculation unit is configured to:
calculate a relative thickness distribution of the pipeline in the measurement region from a measurement result of the plurality of the magnetic sensors,
calculate an absolute thickness of the pipeline in the measurement region from a measurement result of the ultrasonic sensors, and
calculate an absolute thickness distribution of the pipeline in the measurement region, based on a combination of the relative thickness distribution and the absolute thickness.

2. The sensor device according to claim 1 further comprising:
a case portion forming an internal space holding insulating liquid, the internal space being formed around a part of the outer circumference of the pipeline in a longitudinal direction, wherein
the magnetic sensors and the ultrasonic sensors are each disposed in the liquid.

3. The sensor device according to claim 2, wherein
the liquid is interposed between each of the ultrasonic sensors and the outer circumference surface.

4. The sensor device according to claim 2, wherein
the case portion includes
the two end portion members being disposed on both sides of the internal space in the longitudinal direction, and are in contact with the outer circumference surface over an entire circumference of the pipeline, and
a case portion main body that extends between the two end portion members in the longitudinal direction and is in contact with outer circumference surfaces of the two end portion members over the entire circumference of the pipeline,
the magnetic sensors and the ultrasonic sensors are each disposed on a substrate facing the outer circumference surface, and
the two end portion members each include
an annular first supporting surface that supports the case portion main body, and
an annular second supporting surface that supports the substrate, the second supporting surface being more on a center side of the sensor device than the first supporting surface in the longitudinal direction and being closer to the outer circumference surface than the first supporting surface.

5. The sensor device according to claim 4 further comprising:
a tubular sensor housing that extends in the longitudinal direction and is in contact with the second supporting surface over an entire circumference of each of the end portion members, wherein
the substrate is fixed to an inner circumference surface of the sensor housing and is supported by the second supporting surface via the sensor housing.

6. The sensor device according to claim 5, wherein
the sensor housing has a seam extending in the longitudinal direction.

7. The sensor device according to claim 4, wherein
the substrate is a flexible substrate.

8. The sensor device according to claim 4 further comprising:
a transmission unit that is provided outside the case portion and transmits measurement data from each of the magnetic sensors and the ultrasonic sensors; and a connector that is provided through the case portion and electrically connects the transmission unit and the substrate to each other.

9. The sensor device according to claim 1, wherein a number of the ultrasonic sensors is less than one tenth of a number of the plurality of magnetic sensors.

10. The sensor device according to claim 1, wherein a measurement interval of each of the ultrasonic sensors is longer than a measurement interval of each of the plurality of magnetic sensors.

11. The sensor device according to claim 1 further comprising:
a power supply unit that supplies power to each of the plurality of magnetic sensors and each of the ultrasonic sensors, the power generated by temperature difference power generation utilizing a temperature difference between a temperature of a natural resource flowing in the pipeline and a temperature of an environment outside the pipeline.

12. The sensor device according to claim 1, wherein the pipeline is made of a magnetic material.

13. The sensor device according to claim 1, wherein the calculation unit is further configured to calculate the absolute thickness of the pipeline in the measurement region based on a value of ratio between the absolute thickness of the pipeline and a relative thickness in the relative thickness distribution.

14. A pipeline monitoring system comprising:
a plurality of sensor devices, each of which includes:
a plurality of magnetic sensors arranged to face an outer circumference surface of a pipeline; and
ultrasonic sensors arranged to face the outer circumference surface and measure a thickness of the pipeline in a measurement region in which the plurality of magnetic sensors measure a magnetic field, a number of the ultrasonic sensors being less than a number of the plurality of magnetic sensors; and
a calculation device arranged to:
calculate a relative thickness distribution of the pipeline in a mounted region of the sensor devices from a measurement result of the plurality of magnetic sensors,
calculate an absolute thickness of the pipeline in the measurement region from a measurement result of the ultrasonic sensors, and
calculate an absolute thickness distribution of the pipeline in the measurement region, based on a combination of the relative thickness distribution and the absolute thickness.

15. The pipeline monitoring system according to claim 14, wherein
the calculation device includes
a first calculation unit that calculates the relative thickness distribution within the measurement region of the plurality of magnetic sensors based on the measurement result from each of the magnetic sensors,
a second calculation unit that calculates, based on a measurement result from each of the ultrasonic sensors and a relative thickness obtained at a measurement position of an ultrasonic sensor in the relative thickness distribution, a value of ratio between an absolute thickness of the pipeline and a relative thickness in the relative thickness distribution, and
a third calculation unit that calculates the absolute thickness distribution of the pipeline in the measurement region based on the value of ratio and the relative thickness distribution.

16. The pipeline monitoring system according to claim 15, wherein
each of the plurality of sensor devices transmits the measurement result from each of the plurality of magnetic sensors to the calculation device at an interval shorter than a transmission interval of the measurement result from each of the ultrasonic sensors, and
the second calculation unit calculates the value of ratio based on a measurement result most recently obtained from each of the ultrasonic sensors and a relative thickness obtained at a measurement position of the ultrasonic sensor in a relative thickness distribution most recently calculated by the first calculation unit, or calculates the value of ratio based on an absolute thickness most recently calculated by the third calculation unit at any position of the pipeline and a relative thickness obtained at the position in a relative thickness distribution most recently calculated by the first calculation unit.

17. The pipeline monitoring system according to claim 15, wherein
the calculation device further includes a switching unit that outputs to the second calculation unit, a signal instructing switching of calculation processing; and
in response to reception of the signal from the switching unit, the second calculation unit calculates the value of ratio based on a measurement result most recently obtained from each of the ultrasonic sensors and a relative thickness obtained at a measurement position of the ultrasonic sensor in a relative thickness distribution newly calculated by the first calculation unit after the reception of the signal, or calculates the value of ratio based on an absolute thickness most recently calculated by the third calculation unit at any position of the pipeline and a relative thickness obtained at the position in a relative thickness distribution newly calculated by the first calculation unit after the reception of the signal.

* * * * *